US011327135B2

United States Patent
Zhong et al.

(10) Patent No.: US 11,327,135 B2
(45) Date of Patent: May 10, 2022

(54) ARTIFICIAL INTELLIGENCE BASED SUPPRESSION OF CHEMICAL SPECIES IN MAGNETIC RESONANCE IMAGING

(71) Applicants: Siemens Healthcare GmbH, Erlangen (DE); Duke University, Durham, NC (US)

(72) Inventors: Xiaodong Zhong, Oak Park, CA (US); Vibhas S. Deshpande, Austin, TX (US); Mustafa R. Bashir, Cary, NC (US)

(73) Assignees: Siemens Healthcare GmbH, Erlangen (DE); Duke University, Durham, NC (US)

( * ) Notice: Subject to any disclaimer, the term of this patent is extended or adjusted under 35 U.S.C. 154(b) by 71 days.

(21) Appl. No.: 16/916,294

(22) Filed: Jun. 30, 2020

(65) Prior Publication Data
US 2021/0302522 A1    Sep. 30, 2021

Related U.S. Application Data

(60) Provisional application No. 63/000,643, filed on Mar. 27, 2020.

(51) Int. Cl.
    *G01R 33/48*      (2006.01)
    *G01R 33/56*      (2006.01)
    (Continued)

(52) U.S. Cl.
    CPC ..... *G01R 33/4828* (2013.01); *G01R 33/5608* (2013.01); *G06N 3/08* (2013.01);
    (Continued)

(58) Field of Classification Search
    CPC ........... G01R 33/4828; G01R 33/5608; G01R 33/4824; G01R 33/4835; G01R 33/5616;
    (Continued)

(56) References Cited

U.S. PATENT DOCUMENTS 9,194,925 B2    11/2015    Zhong et al.
10,753,997 B2 *    8/2020    Odry .................... G06N 3/0472
    (Continued)

OTHER PUBLICATIONS

Goldfarb, J. et al., "Water-Fat Separation and Parameter Mapping in Cardiac MRI via Deep Learning With a Convolutional Neural Network," J. Magn. Reson. Imaging 50: 655-665 (2019).*
(Continued)

*Primary Examiner* — Xuemei G Chen

(57) ABSTRACT

A computer-implemented method for using machine learning to suppress fat in acquired MR images includes receiving multi-echo images from an anatomical area of interest acquired using an MRI system. A first subset of the multi-echo images is acquired prior to application of contrast to the anatomical area of interest and a second subset of the multi-echo images is acquired after application of contrast to the anatomical area of interest. Next, data is generated including water images, fat images, and effective $R^*_2$ maps from the multi-echo images. The water images, the fat images, and the effective $R^*_2$ maps are used to create synthetic fat suppressed images. A neural network is trained to use the multi-echo images as input and the synthetic fat suppressed images as ground truth. A plurality of components of the neural network are saved to allow later deployment of the neural network on a computing system.

10 Claims, 6 Drawing Sheets

(51) Int. Cl.
*G06T 5/50* (2006.01)
*G06N 3/08* (2006.01)

(52) U.S. Cl.
CPC ...... *G06T 5/50* (2013.01); *G06T 2207/10088* (2013.01); *G06T 2207/20081* (2013.01); *G06T 2207/20084* (2013.01); *G06T 2207/30056* (2013.01)

(58) Field of Classification Search
CPC ...... G01R 33/5617; G01R 33/50; G06N 3/08; G06T 5/50; G06T 2207/10088; G06T 2207/20081; G06T 2207/20084; G06T 2207/30056
See application file for complete search history.

(56) References Cited

U.S. PATENT DOCUMENTS

| | | | |
|---|---|---|---|
| 10,915,990 B2* | 2/2021 | Lebel | G06K 9/6271 |
| 2010/0127702 A1* | 5/2010 | Greiser | G01R 33/3875 324/309 |
| 2011/0227572 A1* | 9/2011 | Deshpande | G01R 33/5607 324/309 |
| 2018/0373678 A1* | 12/2018 | Redfern | G06F 7/5443 |
| 2019/0279361 A1* | 9/2019 | Meyer | G06T 7/12 |
| 2019/0333227 A1* | 10/2019 | Zhang | G06K 9/6262 |
| 2020/0278406 A1* | 9/2020 | Sharma | G01R 33/4828 |
| 2020/0402204 A1* | 12/2020 | Huang | G06T 7/10 |
| 2021/0109177 A1* | 4/2021 | De Weerdt | G01R 33/5607 |

OTHER PUBLICATIONS

Ronneberger, Olaf, Philipp Fischer, and Thomas Brox. "U-net: Convolutional networks for biomedical image segmentation." International Conference on Medical image computing and computer-assisted intervention. Springer, Cham, 2015.

Ren, Jimin, et al. "Composition of adipose tissue and marrow fat in humans by 1H NMR at 7 Tesla." Journal of lipid research 49.9 (2008): 2055-2062.

Rofsky, Neil M., et al. "Abdominal MR imaging with a volumetric interpolated breath-hold examination." Radiology 212.3 (1999): 876-884.

Haase, Axel, et al. "1H NMR chemical shift selective (CHESS) imaging." Physics in Medicine & Biology 30.4 (1985): 341.

Frahm, J., et al. "Chemical shift selective MR imaging using a whole-body magnet." Radiology 156.2 (1985): 441-444.

Dixon, W. Thomas. "Simple proton spectroscopic imaging." Radiology 153.1 (1984): 189-194.

Glover, G. H., and E. Schneider. "Three-point Dixon technique for true water/fat decomposition with B0 inhomogeneity correction." Magnetic resonance in medicine 18.2 (1991): 371-383.

Ma, Jingfei. "Dixon techniques for water and fat imaging." Journal of Magnetic Resonance Imaging: An Official Journal of the International Society for Magnetic Resonance in Medicine 28.3 (2008): 543-558.

Guiu, Boris, et al. "Quantification of liver fat content: comparison of triple-echo chemical shift gradient-echo imaging and in vivo proton MR spectroscopy" Radiology 250.1 (2009): 95-102.

Hussain, Hero K., et al. "Hepatic fat fraction: MR imaging for quantitative measurement and display—early experience." Radiology 237.3 (2005): 1048-1055.

Yokoo, Takeshi, et al. "Nonalcoholic fatty liver disease: diagnostic and fat-grading accuracy of low-flip-angle multiecho gradient-recalled-echo MR imaging at 1.5 T." Radiology 251.1 (2009): 67-76.

Reeder, Scott B., et al. "Quantitative assessment of liver fat with magnetic resonance imaging and spectroscopy." Journal of magnetic resonance imaging 34.4 (2011): 729-749.

O'Regan, Declan P., et al. "Liver fat content and T2*: simultaneous measurement by using breath-hold multiecho MR maging at 3.0 T—feasibility." Radiology 247.2 (2008): 550-557.

Yokoo, Takeshi, et al. "Estimation of hepatic proton-density fat fraction by using MR imaging at 3.0 T." Radiology 258.3 (2011): 749-759.

Koken, P., H. Eggers, and P. Börnert. "Fast single breath-hold 3D abdominal imaging with water-fat separation." Proc Intl Soc Magn Reson Med. vol. 15. 2007.

Yu, Huanzhou, et al. "Multiecho water-fat separation and simultaneous R estimation with multifrequency fat spectrum modeling." Magnetic Resonance in Medicine: An Official Journal of the International Society for Magnetic Resonance in Medicine 60.5 (2008): 1122-1134.

Zhong, Xiaodong, et al. "Liver fat quantification using a multi-step adaptive fitting approach with multi-echo GRE imaging." Magnetic resonance in medicine 72.5 (2014): 1353-1365.

* cited by examiner

ARTIFICIAL INTELLIGENCE BASED SUPPRESSION OF CHEMICAL SPECIES IN MAGNETIC RESONANCE IMAGING

CROSS-REFERENCE TO RELATED APPLICATIONS

This application claims the benefit of U.S. Provisional Application Ser. No. 63/000,643 filed Mar. 27, 2020, which is incorporated herein by reference in its entirety.

TECHNOLOGY FIELD

The present invention relates generally to methods, systems, and apparatuses for implementing artificial intelligence (AI)-based framework for the suppression of chemical species in Magnetic Resonance Imaging (MM). This may be applied, for example, to enhance liver imaging applications.

BACKGROUND

T1 weighted gradient recalled echo (GRE) magnetic resonance imaging (MRI) is a routinely used approach in clinical abdominal examination. The MRI pulse sequence in a volume interpolated breath-hold examination (VIBE) provides three-dimensional (3D) GRE image acquisitions, and serves as a critical contrast type in MM evaluation of the liver.

On T1 weighted GRE images, fat exhibits bright signal intensity compared to that of the liver parenchyma. To increase the image contrast and to better evaluate the liver, fat suppression is a prerequisite for the abdominal imaging protocols of 3D T1 weighted GRE acquisition using VIBE. Homogeneous fat suppression across the entire field-of-view is desirable for reliable depiction of disease. VIBE is also routinely used for 3D multiphase dynamic contrast enhanced imaging acquisition before and after contrast administration for pre- and post-contrast characterization analysis. Reliable and homogeneous fat suppression is also critical for dynamic contrast enhanced imaging.

Fat saturation is the most commonly used technique in the clinical VIBE acquisition for fat suppression. This technique applies a spectrally selective radio-frequency (RF) pre-pulse to selectively excite the fat spins in the imaging volume, and immediately saturates (or spoil) the excited fat spins so that their signal intensities are suppressed in the subsequent VIBE acquisition. In practice, the performance of fat saturation is influenced by B0 field inhomogeneity among other things, leading to non-uniform fat suppression.

An alternative to spectrally selective fat suppression pre-pulses is to use a Dixon approach to separate fat and water signals. Dixon imaging uses acquisitions with distinct fat-water phase differences to separate fat and water images. The original two-point Dixon utilizes in-phase (IN) and opposed-phase (OPP) echo data to generate water and fat images, which may suffer from B0 inhomogeneity, relaxation effects, and fat-water assignment ambiguity. Three-point Dixon and its variants correct B0 inhomogeneity and T2* effect by acquiring one extra echo, reduce T1 effect by relatively long repetition time (TR) and low flip angle (FA), and eliminate fat-water assignment ambiguity by various phase correction methods. Furthermore, research and clinical studies started to explore multi-echo and/or multi-frequency Dixon methods to correct the effects of confounder sources such as field inhomogeneity, T2/T2* and T1, which allow more accurate fat/water separation and the subsequent fat fraction quantification, as well as the quantification of tissue transverse relaxation values (T2 or T2*) or relaxation rates (R2=1/T2 or R2*=1/T2).

The water images generated by Dixon techniques can be used as an alternative to the fat suppressed images by fat saturation. Dixon techniques offer several advantages. First, the water images generally provide more uniform fat suppression than the fat saturated images, because the Dixon techniques are less sensitive to B0 inhomogeneity compared to the fat saturation techniques. Second, it is difficult for the fat saturation techniques to suppress all fat peaks due to the overlapping of fat and water peaks in the spectrum, especially at low field strengths, while the Dixon techniques do not have such a challenge. However, the main disadvantage of Dixon techniques is a longer acquisition time because of the need to acquire two or more echoes, compared to only one echo for fat saturation acquisitions. This often leads to other compromises such as lower image resolution.

SUMMARY

Embodiments of the present invention address and overcome one or more of the above shortcomings and drawbacks, by providing methods, systems, and apparatuses related to artificial intelligence (AI)-based suppression of chemical species in magnetic resonance imaging (MRI). More specifically, an AI-based framework is described herein that jointly combines deep learning neural networks and multi-echo Dixon techniques to suppress the fat in the acquired MR images without the need for performing fat saturation during acquisition. Briefly, in some embodiments, water images calculated by the Dixon methods are used as a ground truth for training the network to generate fat suppressed images, as an alternative to using the acquired fat saturated images as the ground truth to train the network.

According to some embodiments, a computer-implemented method for using machine learning to suppress fat in acquired MR images includes receiving a plurality of multi-echo images from an anatomical area of interest acquired using an MRI system. A first subset of the multi-echo images is acquired prior to application of contrast to the anatomical area of interest and a second subset of the multi-echo images is acquired after application of contrast to the anatomical area of interest. Next, data is generated including a plurality of water images, a plurality of fat images, and a plurality of effective $R^*_2$ maps from the plurality of multi-echo images. The water images, the fat images, and the effective $R^*_2$ maps are used to create a plurality of synthetic fat suppressed images. A neural network is trained to use the multi-echo images as input and the synthetic fat suppressed images as ground truth. A plurality of components of the neural network are saved to allow later deployment of the neural network on a computing system.

According to other embodiments, a computer-implemented method for using machine learning to suppress fat in acquired MR data includes receiving a plurality of multi-echo images from an anatomical area of interest acquired using an MM system without performing fat saturation on the anatomical area of interest. A neural network is used to generate a plurality of synthetic fat suppressed images based on the multi-echo images. Then, the synthetic fat suppressed images may be displayed.

According to other embodiments, a system for using machine learning to suppress fat in acquired MR images comprises an MR imaging system, one or more computers, and a display. The MR imaging system comprises a plurality of coils configured to acquire a plurality of multi-echo images from an anatomical area of interest acquired without performing fat saturation on the anatomical area of interest. The computers are configured to use a neural network to generate a plurality of synthetic fat suppressed images based on the multi-echo images. The display presents the synthetic fat suppressed images.

Additional features and advantages of the invention will be made apparent from the following detailed description of illustrative embodiments that proceeds with reference to the accompanying drawings.

BRIEF DESCRIPTION OF THE DRAWINGS

The foregoing and other aspects of the present invention are best understood from the following detailed description when read in connection with the accompanying drawings. For the purpose of illustrating the invention, there is shown in the drawings embodiments that are presently preferred, it being understood, however, that the invention is not limited to the specific instrumentalities disclosed. Included in the drawings are the following Figures.

DETAILED DESCRIPTION OF ILLUSTRATIVE EMBODIMENTS

The following disclosure describes the present invention according to several embodiments directed at methods, systems, and apparatuses for artificial intelligence (AI)-based suppression of chemical species in magnetic resonance (MR) imaging. More specifically, an AI-based framework is described herein that jointly combines deep learning neural networks and multi-echo Dixon techniques to suppress the fat in the acquired MR images without the need for performing fat saturation during acquisition. These techniques are described herein with respect to the VIBE sequence and demonstrated for liver imaging; however it should be understood that the techniques can be applied in other body parts. These techniques can also be applied to other sequence types including, without limitation, turbo spin echo (TSE), radial, spiral and echo-planar imaging (EPI). In addition to the T1-weighted GRE image contrast described herein, the disclosed techniques can be applied to different image contrasts, including but not limited to proton density (PD) weighted and T2 weighted image contrasts by GRE and/or TSE sequences.

Figure 1:
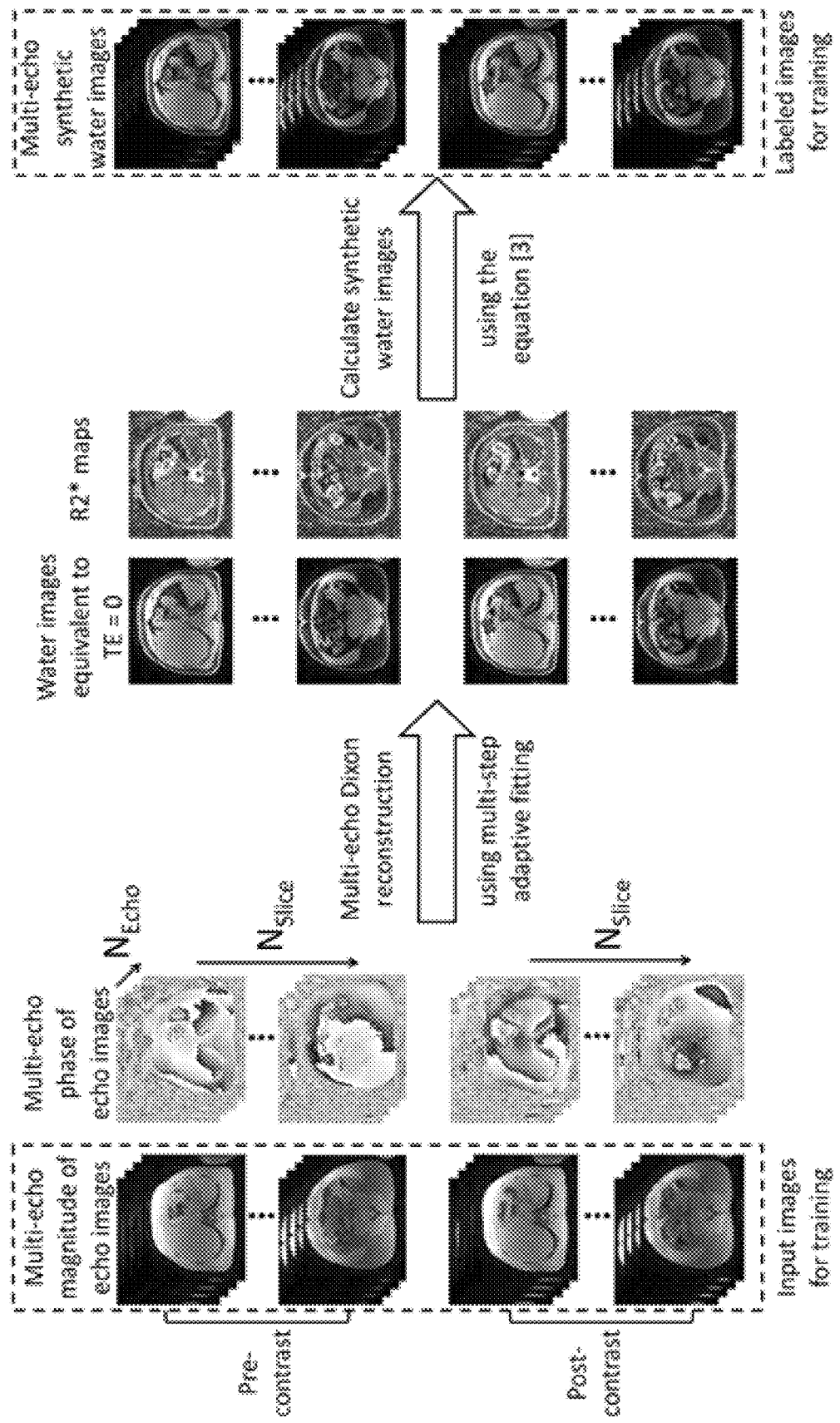
FIG. 1 illustrates the pipeline for preprocessing of data for training and application, according to some embodiments.

FIG. 1 illustrates the pipeline for preprocessing of data for training and application, according to some embodiments. The pipeline starts with a multi-step adaptive fitting multi-echo Dixon module, which is used to calculate the separated water ($M_w$) and fat ($M_f$) images corresponding to the echo time (TE) equal to 0, and the pixel-by-pixel effective R2* values ($R^*_{2eff}$) of the water and fat mixed tissue (effective R2* map), as modeled in the Equation [1]

$$|S_n| = |(M_w + C_n M_f) \cdot e^{-R^*_{2eff} TE_n}| \qquad [1]$$

where $S_n$ is the measured MR signal at the n-th echo; $c_n$ is the complex coefficient at the n-th TE due to the difference of fat and water in the spectrum, which can be calculated using prior knowledge of the fat spectral modeling; $TE_n$ is the n-th echo time. One example technique for this calculation of $c_n$ is described in Ren J, Dimitrov I, Sherry A, Malloy C. Composition of adipose tissue and marrow fat in humans by 1H NMR at 7 Tesla. J Lipid Res 2008; 49:2055-2062. The detailed algorithm using the acquired multi-echo images (typically echoes>=6) to calculate the water ($M_w$) and fat ($M_f$) images as well as the effective R2* ($R^*_{2eff}$) maps is well described in the previous literature including U.S. Pat. No. 9,194,925 entitled "Fat and iron quantification using a multi-step adaptive fitting approach with multi-echo magnetic resonance imaging," the entirety of which is incorporated herein by reference.

Next, the water image and the effective R2* map are used to calculate synthetic water images (also referred to as "synthetic fat suppressed images" herein). First, a synthetic water image $S'_w$ corresponding to any arbitrary TE according to Equation [2]:

$$S'_w = M_w e^{-R^*_{2eff} TE} \qquad [2]$$

Synthetic water images corresponding to any arbitrary TEs may be calculated using Equation [2]. However, in order to use all the acquired echo images as inputs to the convolutional neural network, synthetic water images are calculated according to the acquired TEs as in Equation [3].

$$S'_{wn} = M_w e^{-R^*_{2eff} TE_n} \qquad [3]$$

The originally acquired echo images and their corresponding synthetic water images calculated using Equation [3] are then used to train a deep learning convolutional neural network. Specifically, the echo images are used as input and the synthetic images are used as ground truth (i.e., the ideal expected output). A network trained on such data will reliably provide fat suppressed images from any single-echo VIBE acquisition.

Figure 2:
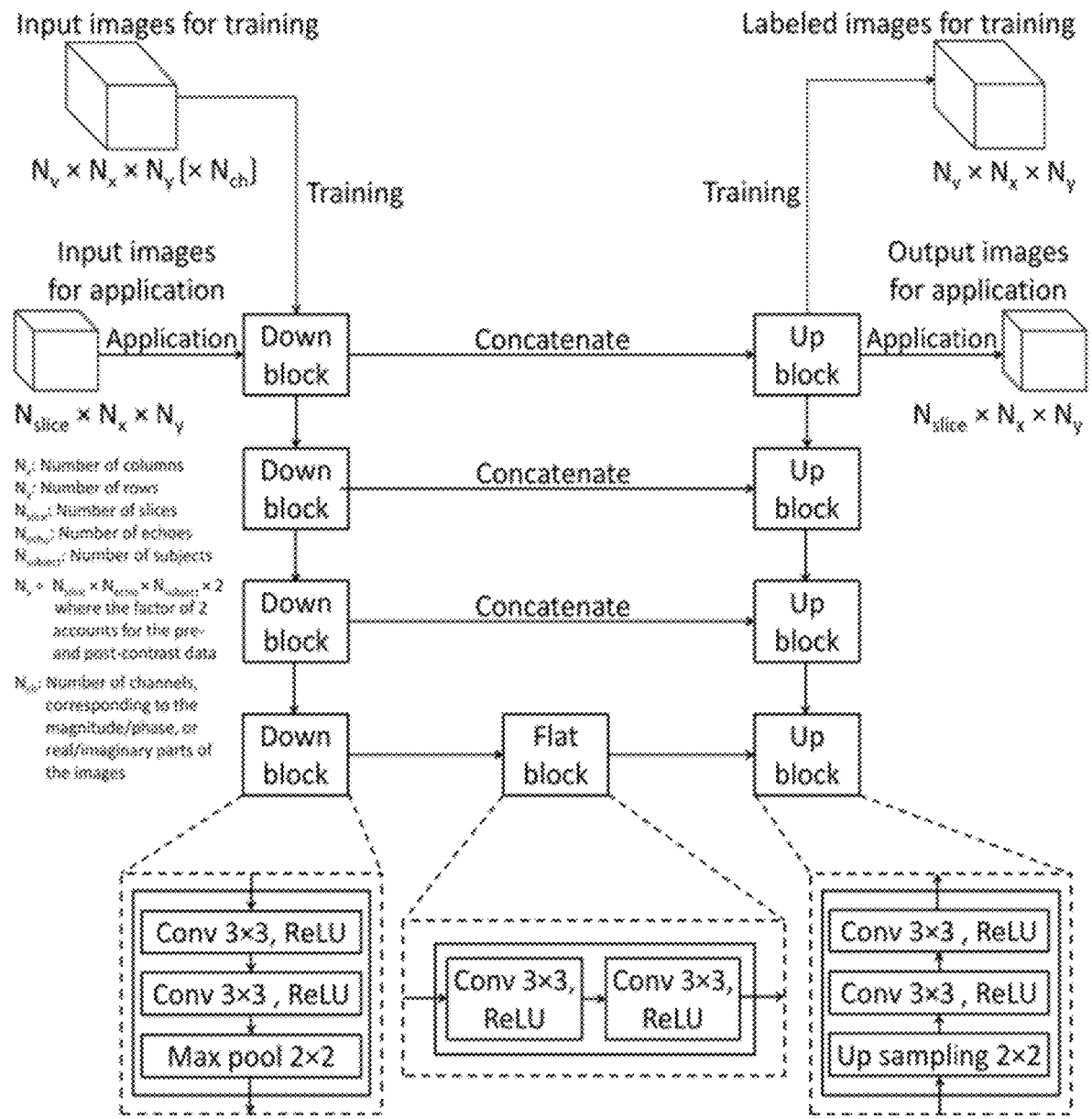
FIG. 2 illustrates an example deep learning network that may be used with the techniques described herein.

FIG. 2 illustrates an example deep learning network that may be used with the techniques described herein. This network is based, in part, on the U-Net structure described in Ronneberger, Olaf; Fischer, Philipp; Brox, Thomas (2015). "U-Net: Convolutional Networks for Biomedical Image Segmentation". arXiv:1505.04597. As shown in FIG. 2, the example U-Net deep learning neural network comprises 4 down blocks, 1 flat block and 4 up blocks. The Cony operation uses the padding with the same size. Images from different dimensions including echoes, slices, subjects, pre- and post-contrast, are organized and sorted into one virtual dimension, $N_v$. In other embodiments, additional dimensions may be added. One such example of an additional dimension could be channels $N_{ch}$, so as to include the magnitude/phase, or real/imaginary parts of the images. For training, an optimizer type of Adam with Nestrov momentum may be used. The loss function in the current implementation is mean squared error (MSE), but alternative loss functions known in the art could also be used.

Figure 3A:
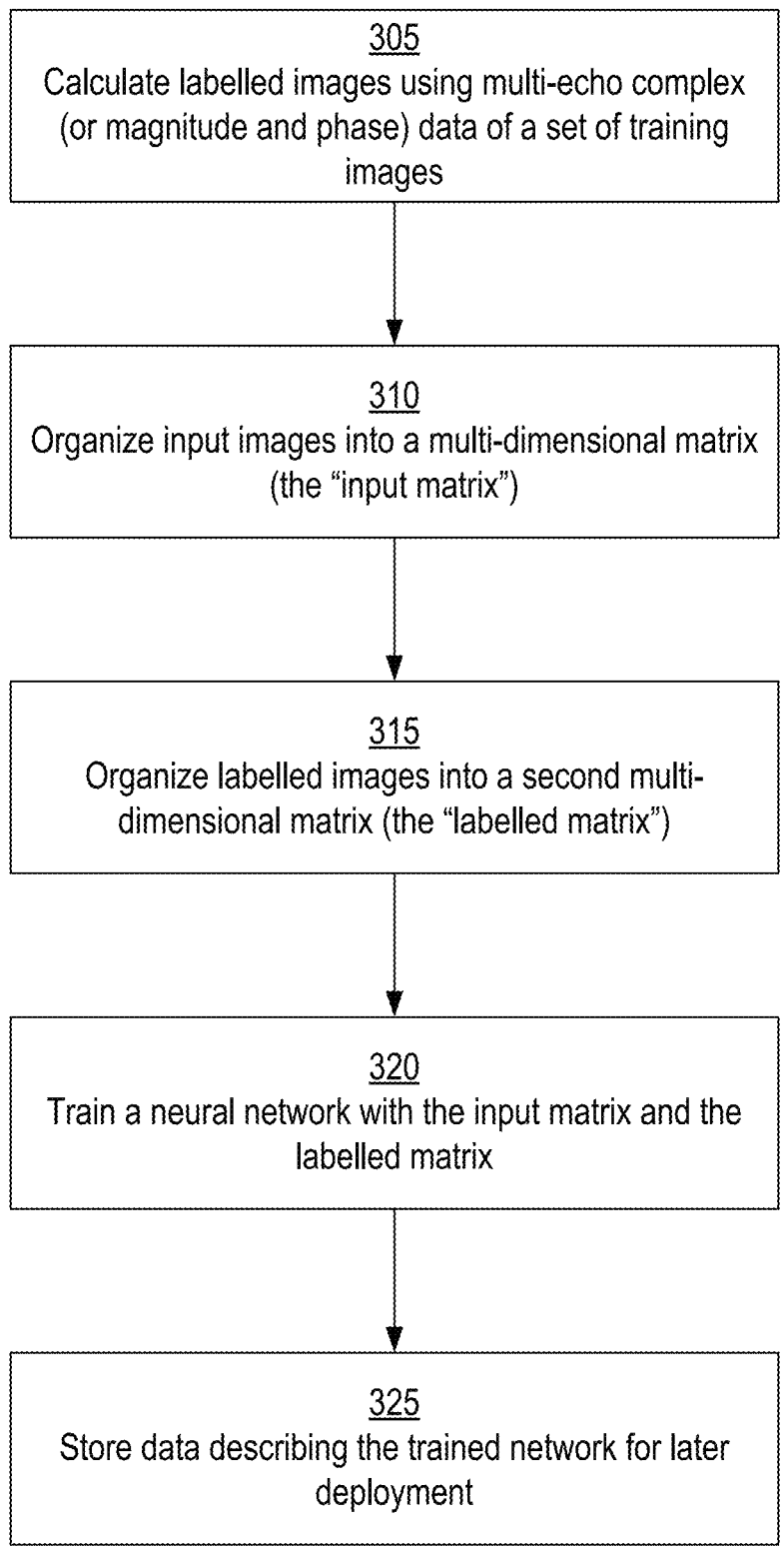
FIG. 3A shows an example workflow for training the AI-based framework, according to the some embodiments.

FIG. 3A shows an example workflow for training the AI-based framework, according to the some embodiments. This workflow is performed using a plurality of training images targeting the anatomical area of interest. Starting at step 305, the multi-echo complex (or magnitude and phase) data of the training images are used to calculate the input and labelled images as described above with reference to FIG. 1.

Continuing with reference to FIG. 3A, at step 310, the input images for training from step 305 are organized into a multi-dimensional matrix $N_v \times N_x \times N_y [\times N_{ch}]$, as explained above with reference to FIG. 2. This matrix is referred to herein as the input matrix. If only magnitude images are used as input images, then $N_{ch}$ is 1 and can be neglected. Alternatively, if complex images are used as input images, then $N_{ch}$ is 2 and magnitude/phase or real/imaginary parts of the image are stored in channel dimension. Next, at step 315, the labelled images (i.e., the ground truth) for training from step 305 are organized into a second multi-dimensional matrix $N_{slice} \times N_x \times N_y$. This matrix is referred to herein as the labelled matrix. At step 320 the neural network is trained using the input matrix and the labelled matrix. Once the network is trained, at step 325 data describing the network is saved to allow later deployment. This descriptive information may include, for example, the structure of the network, the hyper-parameter values, and the weights within each node of the network.

Figure 3B:
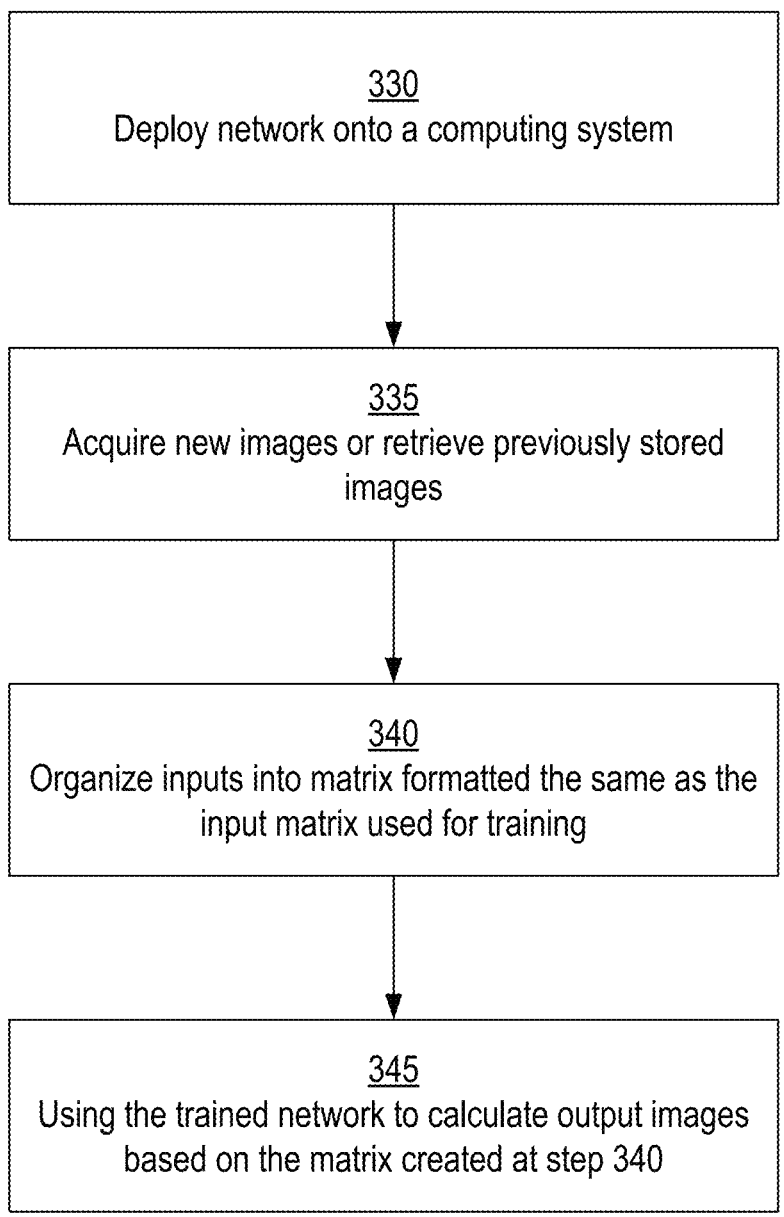
FIG. 3B shows an example workflow for use of the AI-based framework, according to the some embodiments.

FIG. 3B shows an example workflow for use of the AI-based framework, according to the some embodiments. Starting at step 330, the network is deployed onto a computing system and the saved hyper-parameter values and weights are loaded. Next, at step 335, new images are acquired or previously acquired images are retrieved. The multi-echo complex (or magnitude and phase) data of the images is organized into the format of the multi-dimensional matrix that was used for training (i.e., the input matrix) at step 340. Then, at step 345, the output images are calculated using the matrix created at step 340.

Figure 4:
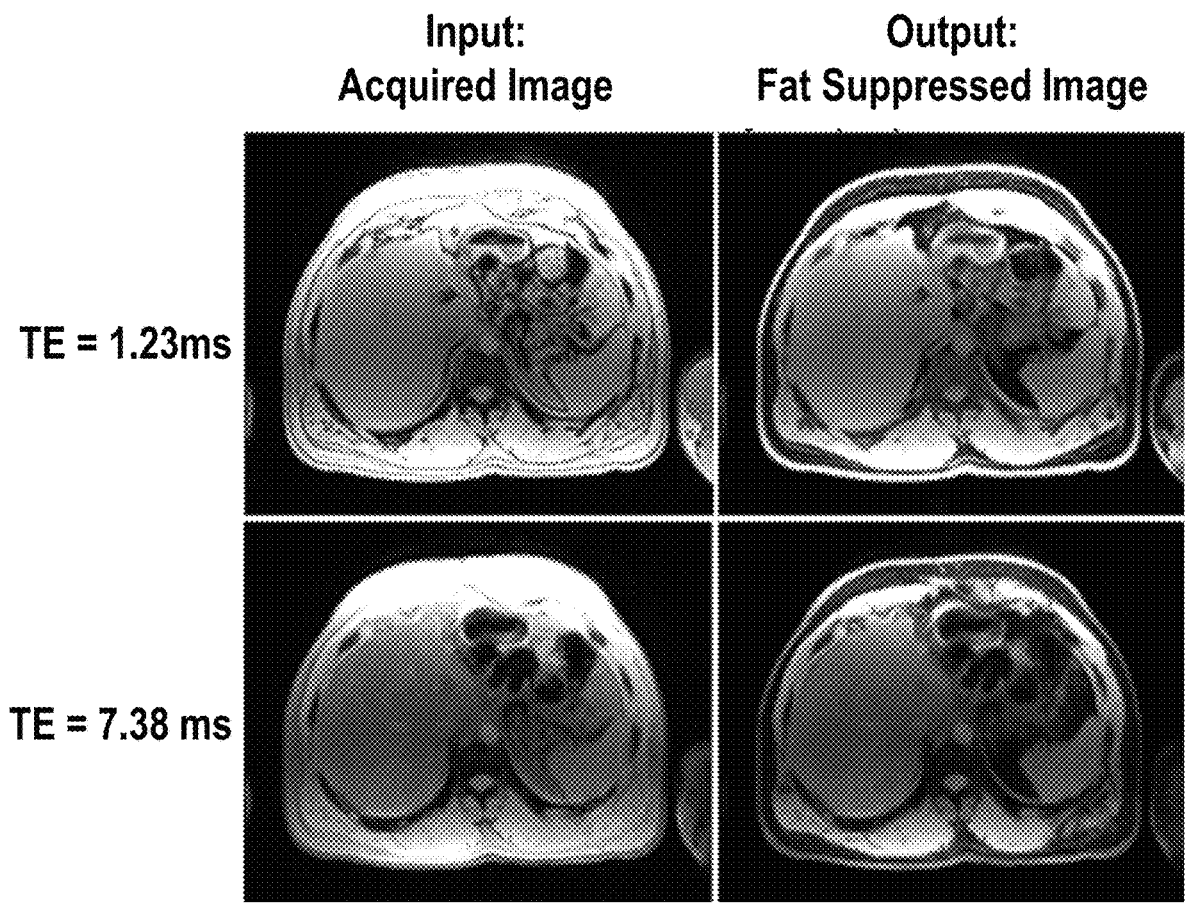
FIG. 4 shows example results of the AI based framework for fat suppression described herein.

FIG. 4 shows example results of AI based framework for fat suppression described herein. The first column of images are the acquired images for TE=1.23 and TE=7.38 ms. The second column shows the output of the neural network: synthetic fat suppressed images for the two TE values.

The AI-based framework as described herein has various advantages over conventional techniques. For example, the framework can provide fat suppressed images which allow the radiologists or physicians to view both non-fat-suppressed and fat-suppressed images for diagnosis while only acquiring non-fat-suppressed images on the MM scanner. The framework also provides volumetric fat suppressed images with a single echo time (TE) acquisition. Furthermore, the framework described herein is insensitive to the influence of various T1 effects, such as contrast-induced T1 changes and flip angle induced T1 changes.

Figure 5:
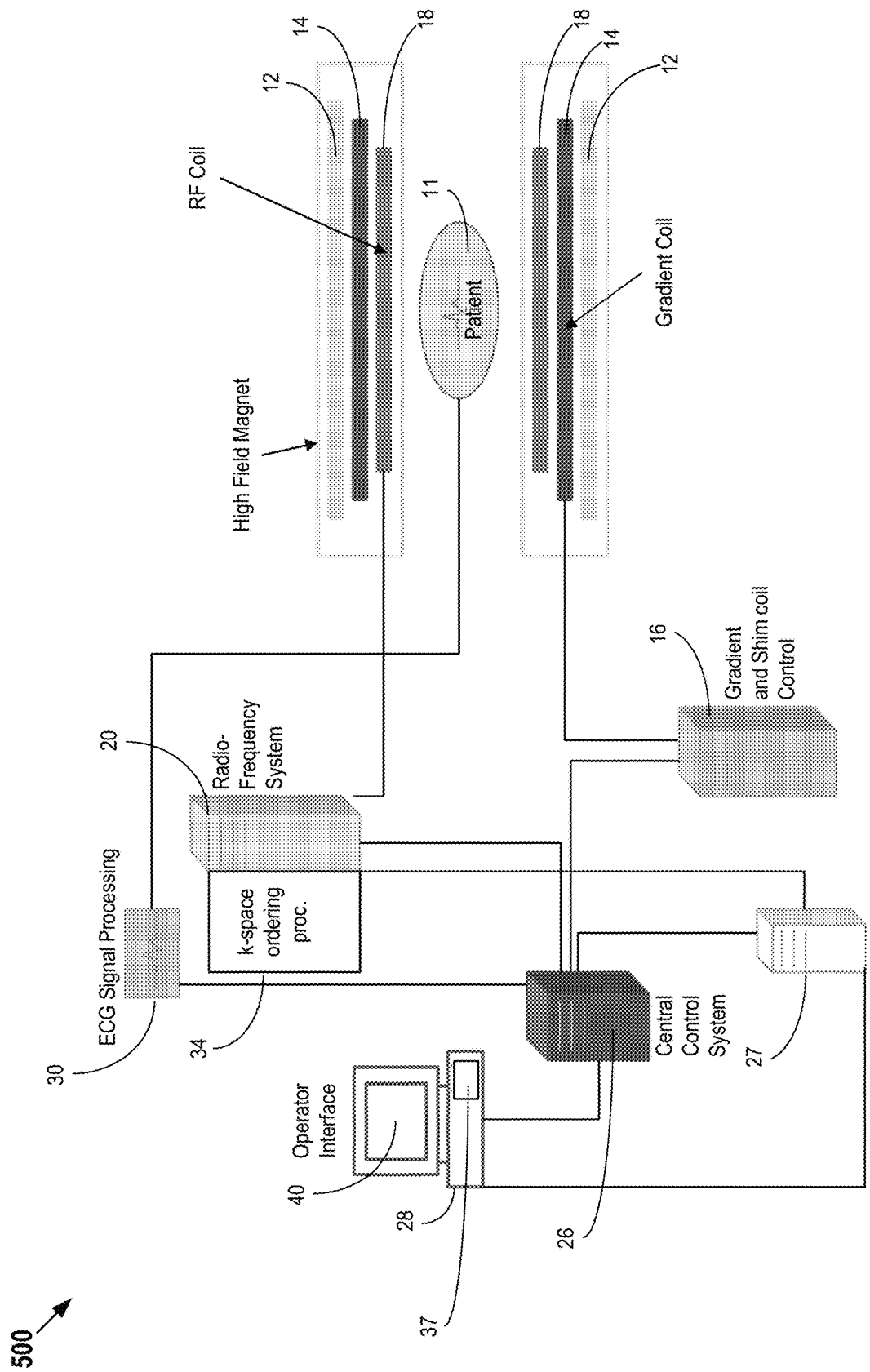
FIG. 5 shows an example MRI system that may be used in acquisition of the reference and dynamic images, according to some embodiments of the present invention.

FIG. 5 shows an example MRI system 500 that may be used in acquisition of the reference and dynamic images, according to some embodiments of the present invention. In system 500, magnetic coils 12 create a static base magnetic field in the body of patient 11 to be imaged and positioned on a table. Within the magnet system are gradient coils 14 for producing position dependent magnetic field gradients superimposed on the static magnetic field. Gradient coils 14, in response to gradient signals supplied thereto by a gradient and shim coil control module 16, produce position dependent and shimmed magnetic field gradients in three orthogonal directions and generates magnetic field pulse sequences. The shimmed gradients compensate for inhomogeneity and variability in an MR imaging device magnetic field resulting from patient anatomical variation and other sources. The magnetic field gradients include a slice-selection gradient magnetic field, a phase-encoding gradient magnetic field and a readout gradient magnetic field that are applied to patient 11.

Further RF (radio-frequency) module 20 provides RF pulse signals to RF coil 18, which in response produces magnetic field pulses which rotate the spins of the protons in the imaged body of the patient 11 by ninety degrees or by one hundred and eighty degrees for so-called "spin echo" imaging, or by angles less than or equal to 90 degrees for so-called "gradient echo" imaging. Gradient and shim coil control module 16 in conjunction with RF module 20, as directed by central control computer 26, control slice-selection, phase-encoding, readout gradient magnetic fields, radio-frequency transmission, and magnetic resonance signal detection, to acquire magnetic resonance signals representing planar slices of patient 11.

In response to applied RF pulse signals, the RF coil 18 receives MR signals, i.e., signals from the excited protons within the body as they return to an equilibrium position established by the static and gradient magnetic fields. The MR signals are detected and processed by a detector within RF module 20 and k-space component processor unit 34 to provide an MR dataset to an image data processor for processing into an image. In some embodiments, the image data processor is located in central control computer 26. However, in other embodiments such as the one depicted in FIG. 11, the image data processor is located in a separate unit 27. Electrocardiogram (ECG) synchronization signal generator 30 provides ECG signals used for pulse sequence and imaging synchronization. A two or three dimensional k-space storage array of individual data elements in k-space component processor unit 34 stores corresponding individual frequency components comprising an MR dataset. The k-space array of individual data elements has a designated center and individual data elements individually that have a radius to the designated center.

A magnetic field generator (comprising coils 12, 14 and 18) generates a magnetic field for use in acquiring multiple individual frequency components corresponding to individual data elements in the storage array. The individual frequency components are successively acquired in an order in which radius of respective corresponding individual data elements increases and decreases along a substantially spiral path as the multiple individual frequency components is sequentially acquired during acquisition of an MR dataset representing an MR image. A storage processor in the k-space component processor unit 34 stores individual frequency components acquired using the magnetic field in corresponding individual data elements in the array. The radius of respective corresponding individual data elements alternately increases and decreases as multiple sequential individual frequency components are acquired. The magnetic field acquires individual frequency components in an order corresponding to a sequence of substantially adjacent individual data elements in the array and magnetic field gradient change between successively acquired frequency components is substantially minimized.

Central control computer 26 uses information stored in an internal database to process the detected MR signals in a coordinated manner to generate high quality images of a selected slice(s) of the body (e.g., using the image data processor) and adjusts other parameters of system 500. The stored information comprises predetermined pulse sequence and magnetic field gradient and strength data as well as data indicating timing, orientation and spatial volume of gradient magnetic fields to be applied in imaging. Generated images are presented on display 40 of the operator interface. Computer 28 of the operator interface includes a graphical user interface (GUI) enabling user interaction with central control computer 26 and enables user modification of magnetic resonance imaging signals in substantially real time. Display processor 37 processes the magnetic resonance signals to provide image representative data for display on display 40, for example.

The embodiments of the present disclosure may be implemented with any combination of hardware and software. In addition, the embodiments of the present disclosure may be included in an article of manufacture (e.g., one or more computer program products) having, for example, computer-readable, non-transitory media. The media has embodied therein, for instance, computer readable program code for providing and facilitating the mechanisms of the embodiments of the present disclosure. The article of manufacture can be included as part of a computer system or sold separately.

The term "computer readable medium" as used herein refers to any medium that participates in providing instructions to the processor for execution. A computer readable medium may take many forms including, but not limited to, non-volatile media, volatile media, and transmission media. Non-limiting examples of non-volatile media include optical disks, solid state drives, magnetic disks, and magneto-optical disks, such as hard disk or removable media drive. One non-limiting example of volatile media is dynamic memory. Non-limiting examples of transmission media include coaxial cables, copper wire, and fiber optics, including the wires that make up one or more buses. Transmission media may also take the form of acoustic or light waves, such as those generated during radio wave and infrared data communications.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

An executable application, as used herein, comprises code or machine readable instructions for conditioning the processor to implement predetermined functions, such as those of an operating system, a context data acquisition system or other information processing system, for example, in response to user command or input. An executable procedure is a segment of code or machine readable instruction, sub-routine, or other distinct section of code or portion of an executable application for performing one or more particular processes. These processes may include receiving input data and/or parameters, performing operations on received input data and/or performing functions in response to received input parameters, and providing resulting output data and/or parameters.

The functions and process steps herein may be performed automatically or wholly or partially in response to user command. An activity (including a step) performed automatically is performed in response to one or more executable instructions or device operation without user direct initiation of the activity.

The system and processes of the figures are not exclusive. Other systems, processes and menus may be derived in accordance with the principles of the invention to accomplish the same objectives. Although this invention has been described with reference to particular embodiments, it is to be understood that the embodiments and variations shown and described herein are for illustration purposes only. Modifications to the current design may be implemented by those skilled in the art, without departing from the scope of the invention. As described herein, the various systems, subsystems, agents, managers and processes can be implemented using hardware components, software components, and/or combinations thereof. No claim element herein is to be construed under the provisions of 35 U.S.C. 112(f), unless the element is expressly recited using the phrase "means for."

We claim:

1. A computer-implemented method for using machine learning to suppress fat in acquired magnetic resonance (MR) images, the method comprising:
receiving a plurality of multi-echo images from an anatomical area of interest acquired using an MRI system, wherein a first subset of the multi-echo images is acquired prior to application of contrast to the anatomical area of interest and a second subset of the multi-echo images is acquired after application of contrast to the anatomical area of interest;
generating a plurality of water images, a plurality of fat images, and a plurality of effective $R^*_2$ maps from the plurality of multi-echo images;
using the water images, the fat images, and the effective $R^*_2$ maps to create a plurality of synthetic fat suppressed images;
training a neural network to use the multi-echo images as input and the synthetic fat suppressed images as ground truth; and
saving a plurality of components of the neural network to allow later deployment of the neural network on a computing system.

2. The method of claim 1, wherein the plurality of water images and the plurality of fat images correspond to an echo time (TE) equal to 0.

3. The method of claim 2, wherein each synthetic fat suppressed image corresponds to a distinct TE value greater than 0.

4. The method of claim 1, wherein the synthetic fat suppressed images are generated using multi-echo Dixon reconstruction and multi-step adaptive fitting.

5. The method of claim 1, wherein the neural network is a deep learning network.

6. The method of claim 5, wherein the deep learning network is based on a U-Net structure.

7. The method of claim 5, wherein the plurality of multi-echo images are acquired in a plurality of dimensions and the deep learning network transforms the plurality of dimensions into a single virtual dimension.

8. The method of claim 7, wherein the plurality of dimensions correspond to echoes, slices, subjects, pre-contrast processing, and post-contrast processing.

9. The method of claim 8, wherein the plurality of dimensions further include channels of the MRI system used in acquiring the multi-echo images.

10. The method of claim 1, wherein the plurality of components of the neural network comprise a structural description of the neural network, one or more hyperparameters used in training the neural network, and one or more weights resulting from training of the neural network.

* * * * *